United States Patent
Prima et al.

(10) Patent No.: US 7,709,916 B2
(45) Date of Patent: May 4, 2010

(54) OPTICAL SEMICONDUCTOR DEVICE HAVING PHOTOSENSITIVE DIODES AND PROCESS FOR FABRICATING SUCH A DEVICE

(75) Inventors: Jens Prima, La Tronche (FR); Francois Roy, Seyssins (FR)

(73) Assignee: STMicroelectronics S.A., Montrouge (FR)

( * ) Notice: Subject to any disclaimer, the term of this patent is extended or adjusted under 35 U.S.C. 154(b) by 1146 days.

(21) Appl. No.: 11/335,908

(22) Filed: Jan. 13, 2006

(65) Prior Publication Data

US 2009/0140363 A1    Jun. 4, 2009

(30) Foreign Application Priority Data

Jan. 14, 2005    (FR)    ................... 05 00408

(51) Int. Cl.
*H01L 31/00* (2006.01)
*H01L 51/40* (2006.01)

(52) U.S. Cl. ......................... 257/433; 438/66

(58) Field of Classification Search ................ 257/443, 257/433, 59, 291, 440, E31.119, E27.131; 438/66, 48, 57, 73, 74, 80
See application file for complete search history.

(56) References Cited

U.S. PATENT DOCUMENTS

| 4,412,900 | A | * | 11/1983 | Tanaka et al. | .......... 204/192.26 |
| 6,325,977 | B1 | * | 12/2001 | Theil | ........................ 422/82.05 |
| 6,964,916 | B2 | * | 11/2005 | Kuo et al. | .................... 438/462 |
| 2006/0018175 | A1 | * | 1/2006 | Liljedahl et al. | ............. 365/222 |
| 2006/0249762 | A1 | * | 11/2006 | Rieve et al. | .................. 257/291 |

FOREIGN PATENT DOCUMENTS

| JP | 59056765 | 4/1984 |
| JP | 60258959 | 12/1985 |
| JP | 61148870 | 7/1986 |
| JP | 62219963 | 9/1987 |
| WO | WO02/093653 | 11/2002 |

OTHER PUBLICATIONS

Preliminary French Search Report for French Appl. No. 0500408 dated Oct. 12, 2005.

* cited by examiner

*Primary Examiner*—Thomas L Dickey
*Assistant Examiner*—Nikolay Yushin
(74) *Attorney, Agent, or Firm*—Lisa K. Jorgenson; Jose Gutman; Fleit Gibbons Gutman Bongini & Bianco P.L.

(57) ABSTRACT

An optical semiconductor device includes, in a zone (5), a structure of photosensitive diodes including a matrix (6) of lower electrodes (7), an intermediate layer (9) made of a photosensitive material formed on the matrix of lower electrodes and at least one upper electrode (10*a*) formed on the intermediate layer, in which an electrical connection (3*a*) includes at least one electrical contact pad (7*a*) and at least one electrical connection pad (16*a*) are produced beneath the intermediate layer, at least one electrical connection via (14) is produced through the intermediate layer and connects the upper electrode to the electrical contact pad and at least one well (15*a*) is formed outside the zone (5) and passes through at least the intermediate layer (9) in order to expose the electrical connection pad (16*a*). Also provided is a process for fabricating such a device.

18 Claims, 9 Drawing Sheets

OPTICAL SEMICONDUCTOR DEVICE HAVING PHOTOSENSITIVE DIODES AND PROCESS FOR FABRICATING SUCH A DEVICE

CROSS-REFERENCE TO RELATED APPLICATION

This application is based upon and claims priority from prior French Patent Application No. 05 00408, filed on Jan. 14, 2005, the entire disclosure of which is herein incorporated by reference.

BACKGROUND OF THE INVENTION

1. Field of the Invention

The present invention relates to the field of optical semiconductor devices, and more particularly to an optical semiconductor device having a structure of photosensitive diodes.

2. Description of the Related Art

U.S. Pat. No. 6,455,836 discloses a photosensitive semiconductor device that comprises, on top of a base layer, an intermediate layer made of a photosensitive material, projecting lower electrodes in this layer and an upper layer that includes an upper electrode. A lateral well passes through the intermediate layer and the upper layer. The base layer includes connection means that are connected selectively to the lower electrodes and comprise connection pads placed in the bottom of the aforementioned well. A local layer made of an electrically-conductive non-transparent material covers some of the diodes in order to form an optical barrier and extends along the sidewalls and in the bottom of the well so as to electrically connect the upper electrode to the electrical connection pads. Such an arrangement is not suitable for implementation on standard fabrication machines, especially planarization machines, and requires a tricky final operation to produce the local layer.

Accordingly, there exists a need for overcoming the disadvantages of the prior art as discussed above.

SUMMARY OF THE INVENTION

An embodiment of the present invention provides an optical semiconductor device comprising photosensitive diodes of simplified structure and simplified fabrication.

The first subject of the present invention is a semiconductor device comprising, in a zone, a structure of photosensitive diodes comprising a matrix of lower electrodes, an intermediate layer made of a photosensitive material formed on the matrix of lower electrodes, and at least one upper electrode formed on the intermediate layer.

According to the invention, the device comprises, beneath the intermediate layer, electrical connection means that include at least one electrical contact pad and at least one electrical connection pad.

According to the invention, the device comprises at least one electrical connection via passing through at least the intermediate layer and connecting the upper electrode to the electrical contact pad.

According to the invention, the device has at least one well formed outside the zone and passing through at least the intermediate layer, this well exposing the electrical connection pad.

According to the invention, the device preferably comprises a lower dielectric layer in which the matrix of lower electrodes and the at least one electrical contact pad are formed and, beneath this lower layer, a base layer in which the at least one electrical connection pad is formed, the at least one well passing through this lower layer in order to expose this electrical connection pad.

According to the invention, the device preferably includes an upper layer comprising a first layer constituting the second electrode and a second layer made of an electrically conductive material, the at least one via and the at least one well passing through this upper layer.

According to the invention, the device preferably includes a non-transparent local layer that partly covers the structure of photosensitive diodes.

According to the invention, the local layer is preferably made of an electrically conductive material, the at least one via being connected to this local layer.

According to the invention, the device preferably includes at least one transparent outer protective layer.

Another subject of the present invention is a process for fabricating an optical semiconductor device comprising a multiplicity of photosensitive diodes comprising lower electrodes and at least one upper electrode that are separated by an intermediate layer made of a photosensitive material.

According to the invention, this process consists of: producing a base layer that includes electrical connection means; forming a dielectric lower layer above the base layer; forming, in the lower layer, a matrix of lower electrodes that are selectively connected to the electrical connection means; producing an intermediate layer made of a photosensitive material on the lower layer; forming an upper layer made of an electrically conductive transparent material; forming at least one via made of an electrically conductive material through the intermediate and upper layers so as to electrically connect the upper layer and at least one of the lower electrodes; and producing at least one well through the lower, intermediate and upper layers so as to expose at least one electrical connection pad of the electrical connection means, the at least one electrical connection pad being connected to the at least one via.

According to the invention, the at least one via is preferably produced above the corresponding lower electrode.

According to the invention, the process preferably consists in forming an upper layer comprising a first layer made of a first electrically conductive material and a second layer made of a second electrically conductive material.

According to the invention, the process preferably consists in forming a local layer made of a non-transparent material above the upper layer and extending partly above the multiplicity of photosensitive diodes.

According to the invention, the process preferably consists in forming a protective outer layer made of a transparent material.

BRIEF DESCRIPTION OF THE DRAWINGS

The present invention will be more clearly understood from studying the optical semiconductor devices having photosensitive diodes that are described by way of non-limiting examples and illustrated schematically by the drawing in which.

DETAILED DESCRIPTION

Figure 1:
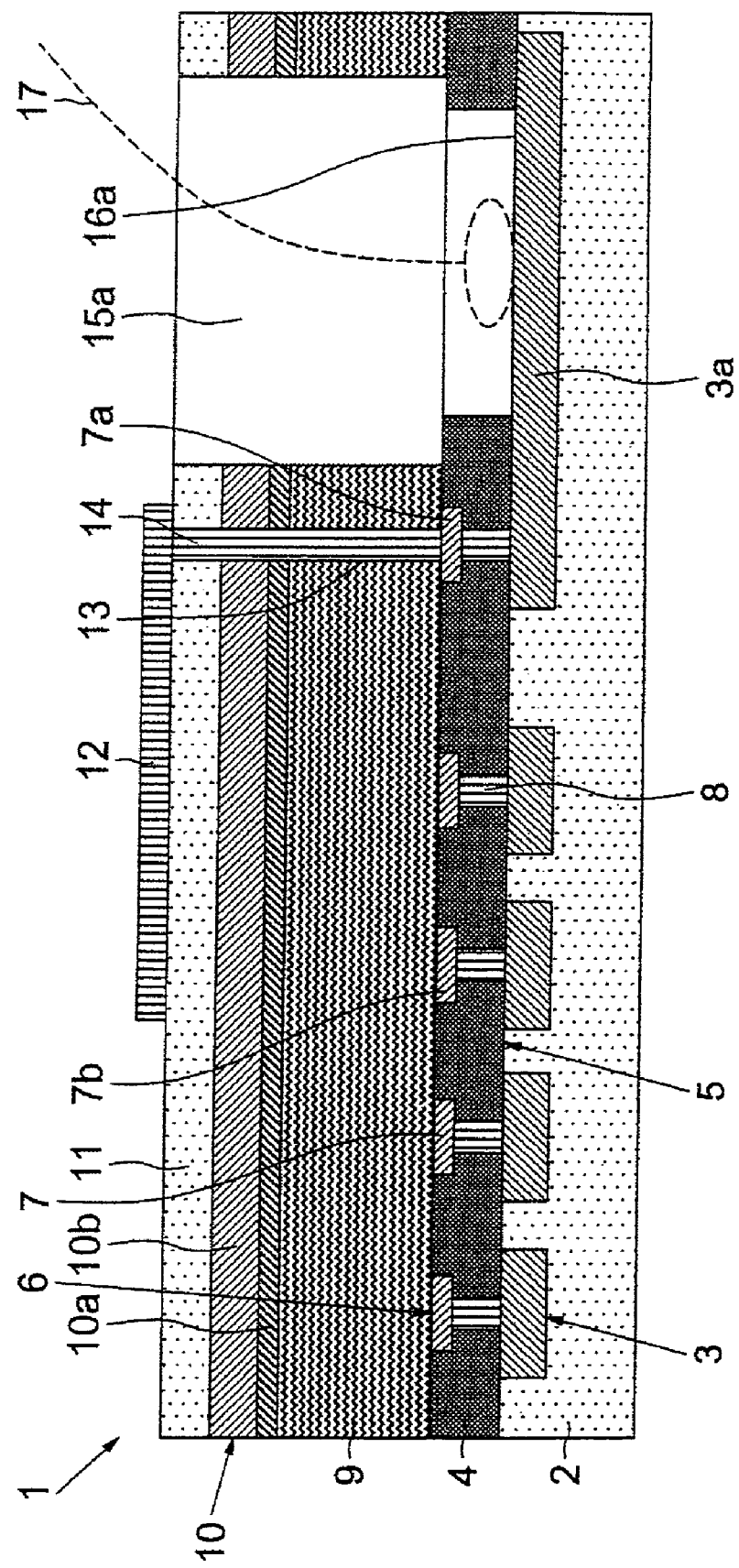
FIG. 1 shows a sectional view of an optical semiconductor device according to the invention.
Figure 2:
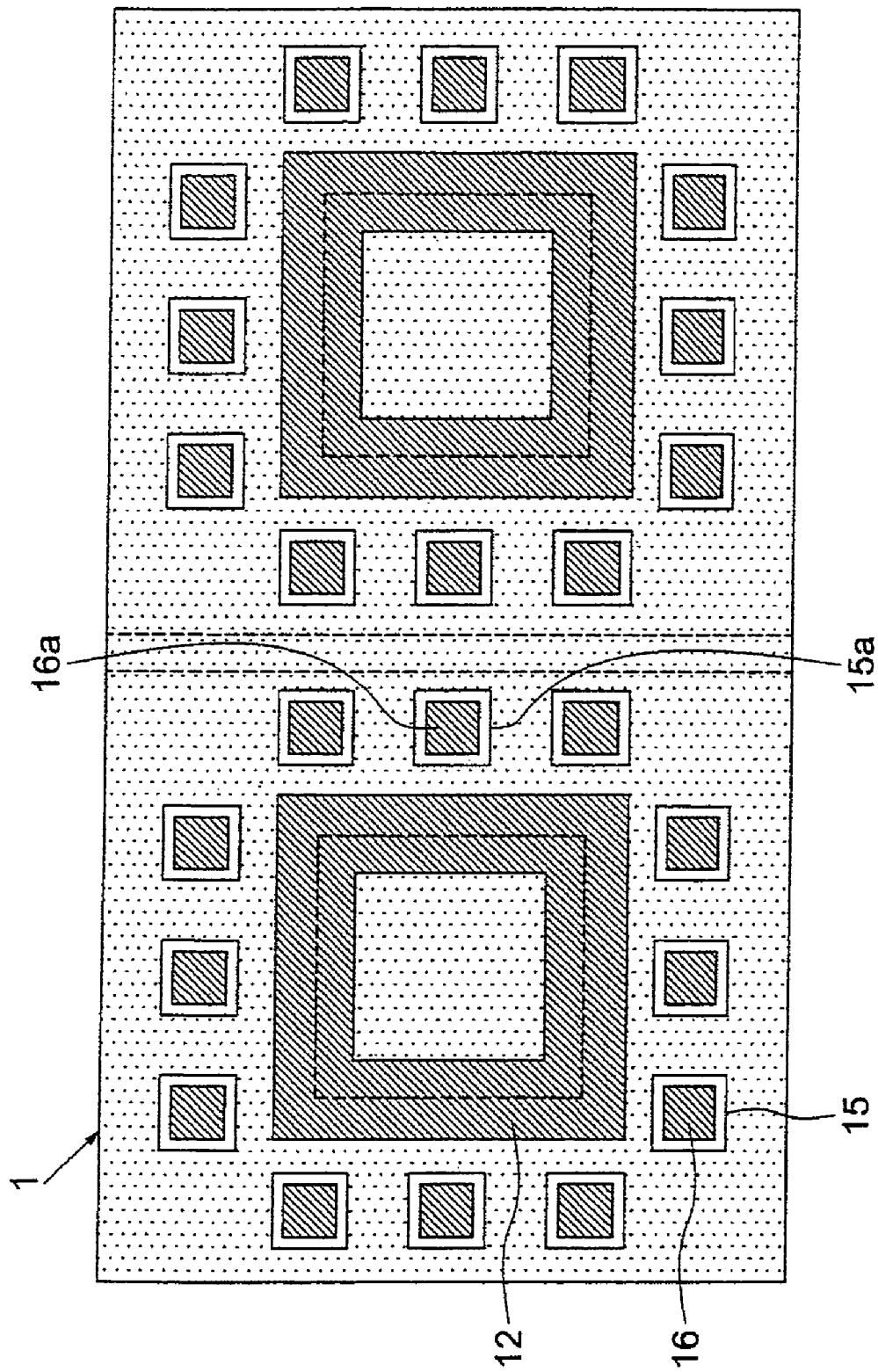
FIG. 2 shows a top view of the device of FIG. 1.

Referring to FIGS. 1 and 2, these show a semiconductor device 1 in the final state.

This device 1 comprises a dielectric base layer 2 that includes electrical connection means 3 flush with its surface and, on this base layer, a dielectric lower layer 4.

This lower layer 4 includes, in a zone 5, a matrix 6 of lower electrodes 7 that are flush with its surface and are selectively connected to the electrical connection means 3 by electrical connections vias 8. The lower electrodes 7 may in particular be made of chromium or n-doped silicon.

The device 1 includes, on the lower layer 4, an intermediate layer 9 made of a photosensitive material which may in particular be amorphous or polycrystalline silicon.

The device 1 includes, on the intermediate layer 9, a transparent upper layer 10 formed by a first layer 10a of a first electrically conductive material, constituting an upper electrode, and a second layer 10b made of a second electrically conductive material. The first layer 10a may in particular be p-doped silicon and the second layer 10b may in particular be ITO (indium tin oxide).

The device 1 includes, on the intermediate layer 10, an insulating transparent outer protective layer 11.

The device 1 includes, on the outer layer 11, a non-transparent local layer 12 that, in the example, extends in the form of a ring covering the lower electrodes of two or three outer rows of the matrix 6. This local layer 12 may in particular be made of a metal of the Al or Ti/TiN type.

The device 1 has holes 13 that extend through the aforementioned layers 9, 10 and 11, between the local layer 12 and the lower electrodes 7a of the outer row of the matrix 6 of lower electrodes. These holes are filled with an electrically conductive material, for example copper, constituting vias 14 for electrically connecting the layer 10 by lateral contact to the lower electrodes 7a that constitute electrical connection pads. The local layer 12 extends or passes over the vias 14 and so is connected to these vias and to the branch 3a through these vias.

Advantageously, the local layer 12 and the vias 14 can be made with the same material. They can be realized in a single step of the process.

It follows from the foregoing that, with the exception of the peripheral zone corresponding to the vias 14 associated with the lower electrodes 7a, the device 1 has a structure 6a of photosensitive diodes formed between the remaining lower electrodes 7b and the upper electrode 10a. The photosensitive diodes located facing the central aperture in the local annular layer 12 are sensitive to the external light, while the photosensitive diodes located beneath this non-transparent local annular layer 12 are not sensitive thereto.

Outside the zone 5, and therefore outside the local annular layer 12, the device 1 has a multiplicity of wells 15 distributed around its periphery, which pass through the layers 4, 9, 10 and 11. These wells expose electrical connection pads 16 that are selectively connected to the electrical connection means 3.

In particular, a well 15a exposes an electrical connection pad 16a that is exclusively connected to the electrodes 7a, and therefore to the upper electrode 10, by the intermediary of the vias 14 and of a branch 3a.

The device 1 can be connected to any other electrical or electronic means by the intermediary of electrical connection wires 17, the ends of which are respectively introduced into the wells 15 and bonded to the corresponding electrical connection pads.

One method of fabricating the semiconductor device 1 described above, employing known techniques, especially etching, deposition and planarization, will now be described with reference to FIGS. 3 to 8.

Figure 3:
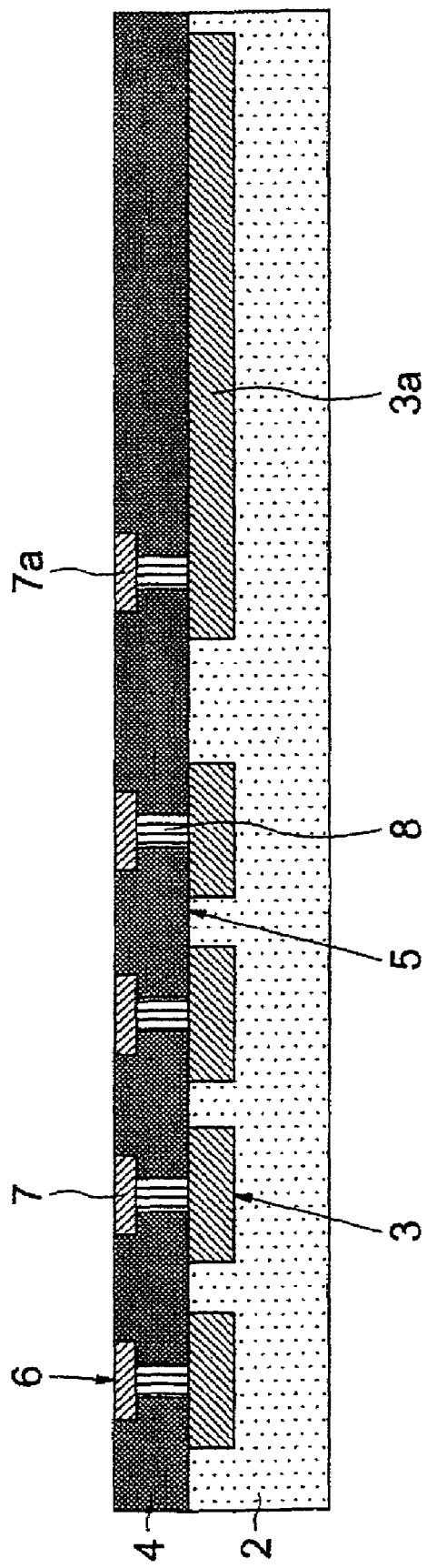
FIG. 3 shows a first step in the fabrication of the device of FIG. 1, in a sectional view.
Figure 4:
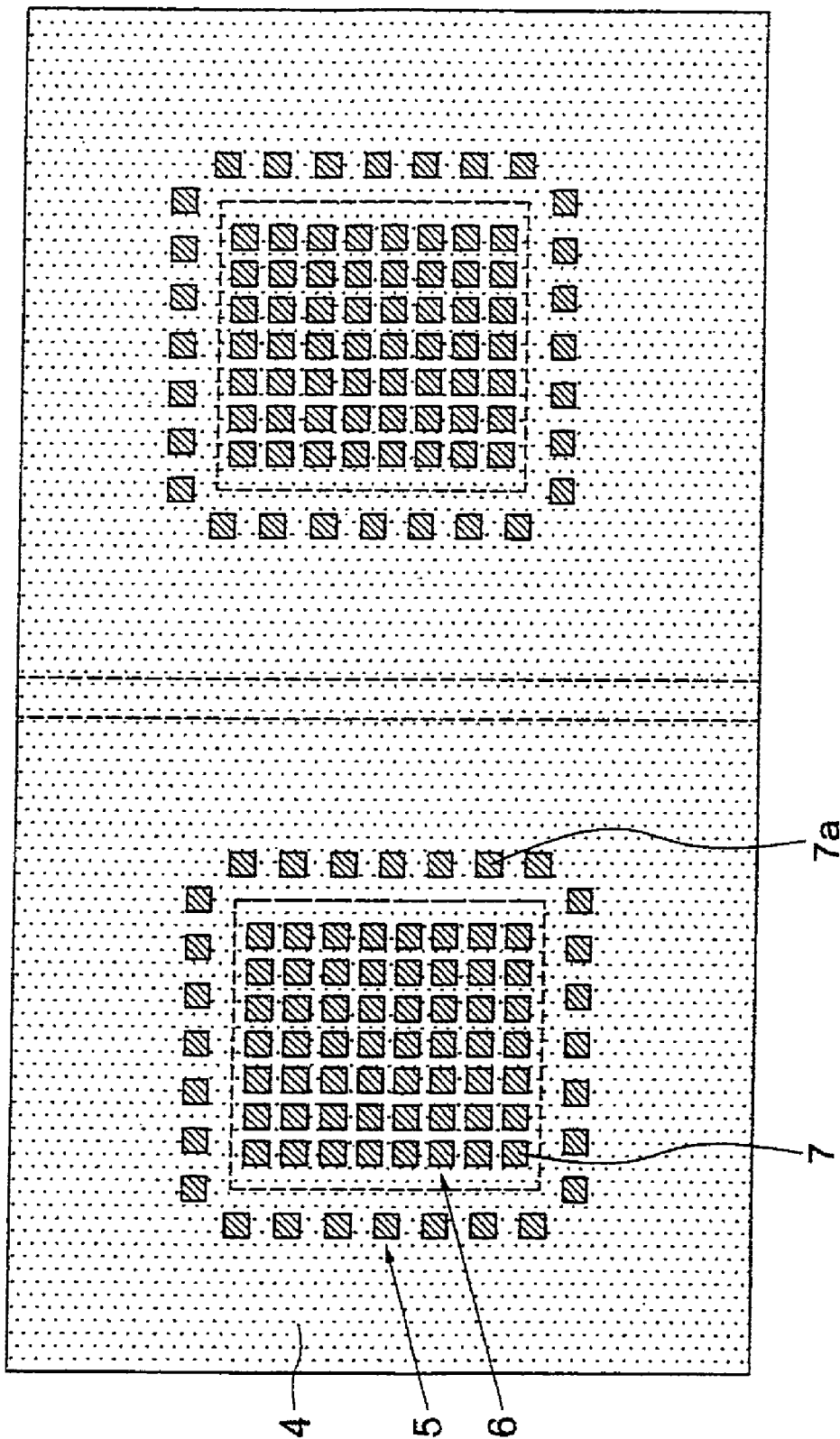
FIG. 4 shows a top view of FIG. 3.

As FIGS. 3 and 4 show, after the connection means 3 have been produced in the base layer 2 and its surface has been planarized, the process continues with the deposition of the upper layer 4. The vias 8 are produced, and then the matrix 6 of lower electrodes 7.

Figure 5:
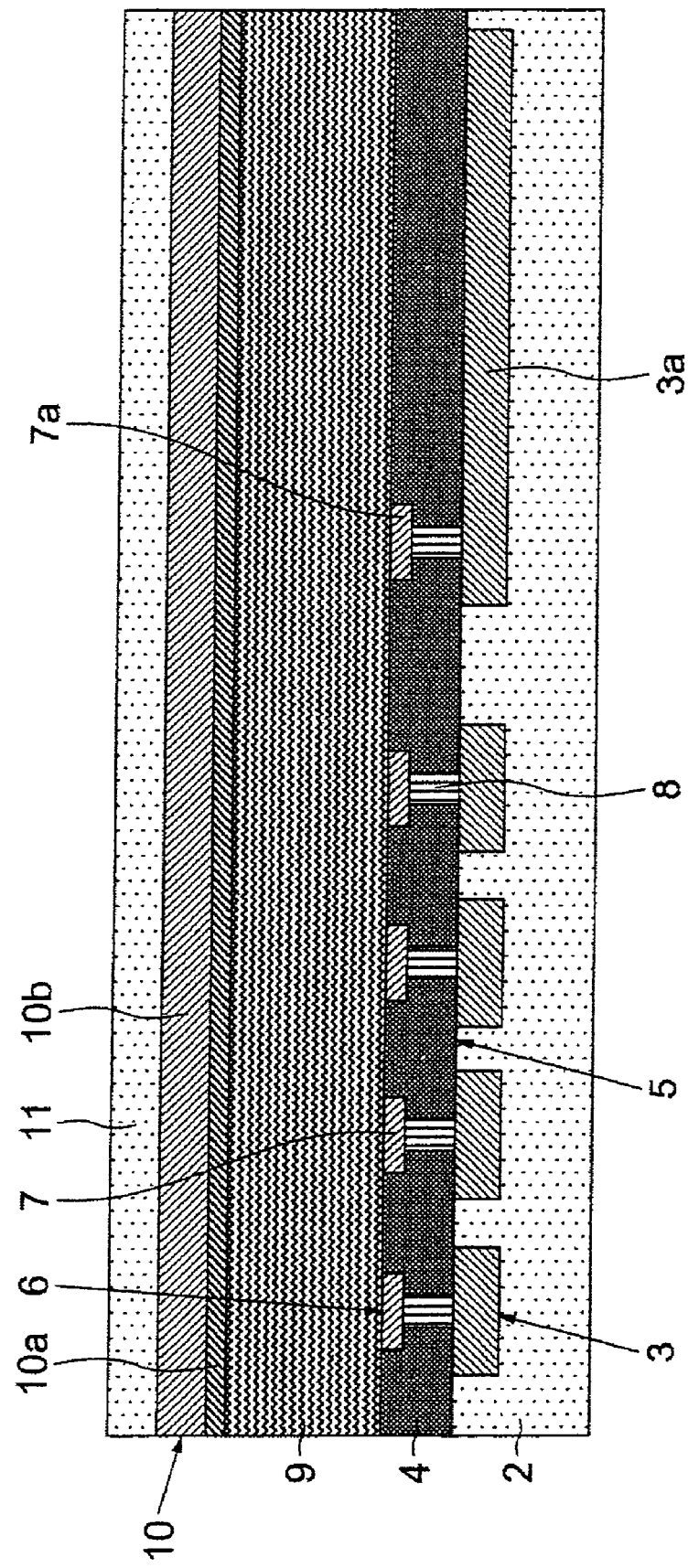
FIG. 5 shows a second step on the fabrication of the device of FIG. 1, in a sectional view.

As FIG. 5 shows, after the surface of the layer 4, including the vias 8 and the lower electrodes 7, have been planarized, the process continues with the deposition of the intermediate layer, of the layer 10, by successively depositing its first layer 10a and its second layer 10b, and of the outer layer 11, optionally with intermediate planarization operations being carried out.

Figure 6:
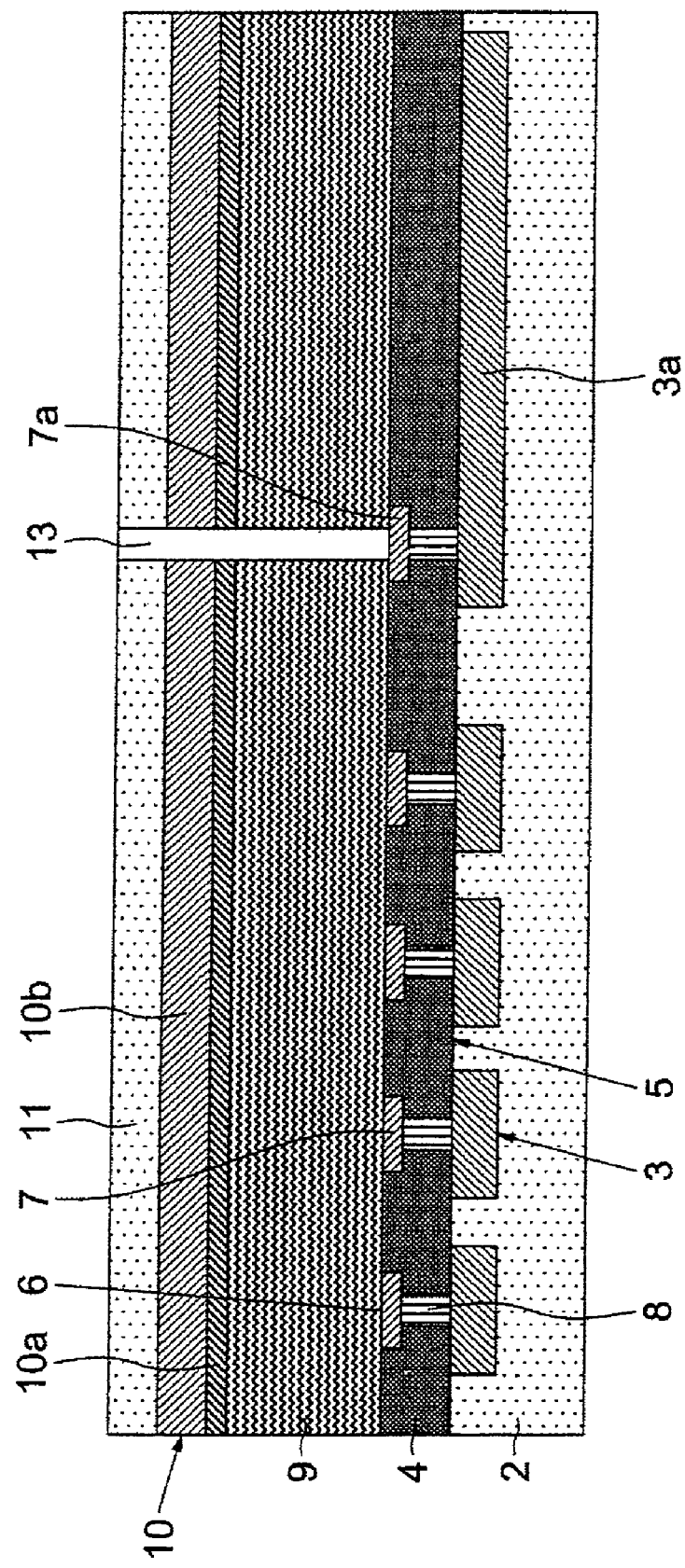
FIG. 6 shows a third step in the fabrication of the device of FIG. 1, in a sectional view.

As FIG. 6 shows, holes 13 are produced through the layers 9, 10 and 11, down to just above the peripheral lower electrodes 7a.

Figure 7:
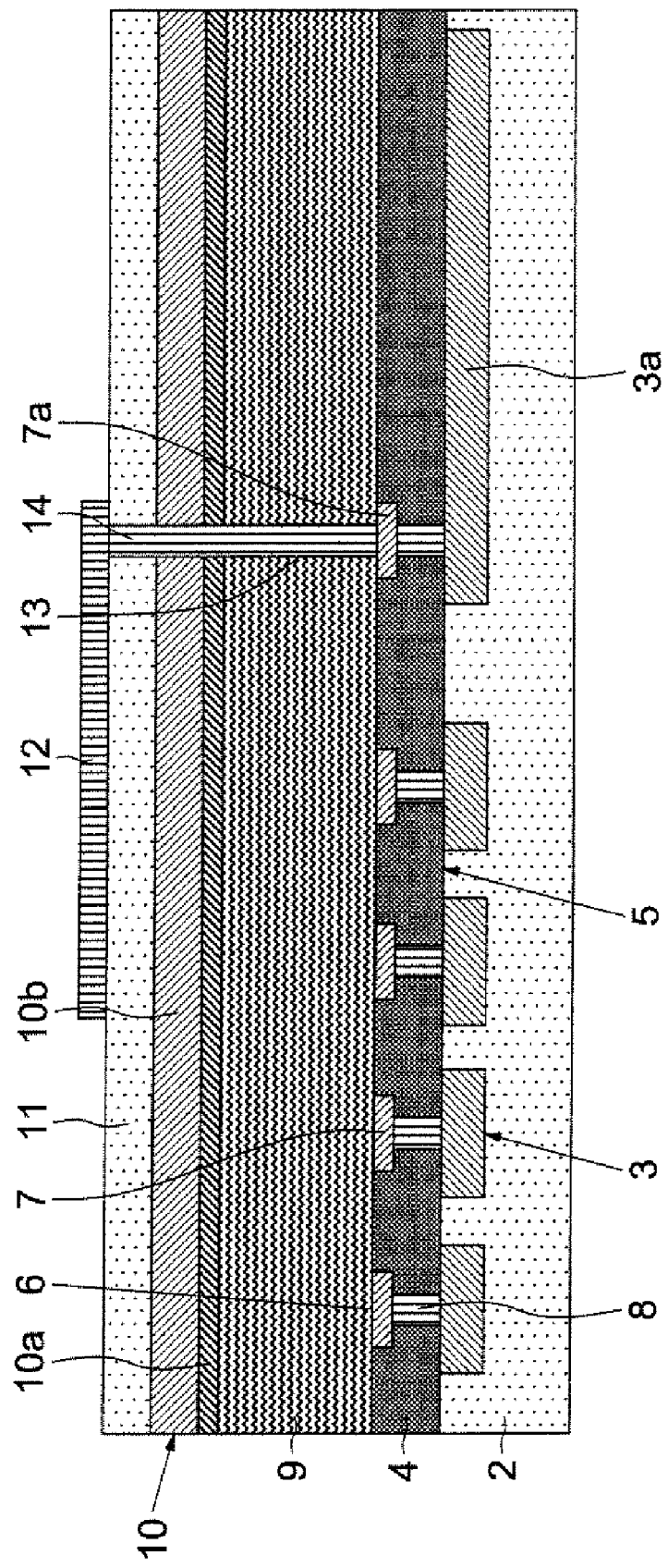
FIG. 7 shows a fourth step in the fabrication of the device of FIG. 1, in a sectional view.

As FIG. 7 shows, the vias 14 are then produced, followed by the local layer 12.

Finally, the wells 15 are produced through the layers 4, 9, 10 and 11 down to the connection pads 16 so as to finally obtain the device as shown in FIGS. 1 and 2.

As shown in FIGS. 2 and 4, preferably several devices 1 located beside one another are produced on a common base layer 2, by carrying out the aforementioned operations jointly. Each individual device 1 is then produced, for example by sawing.

Figure 8:
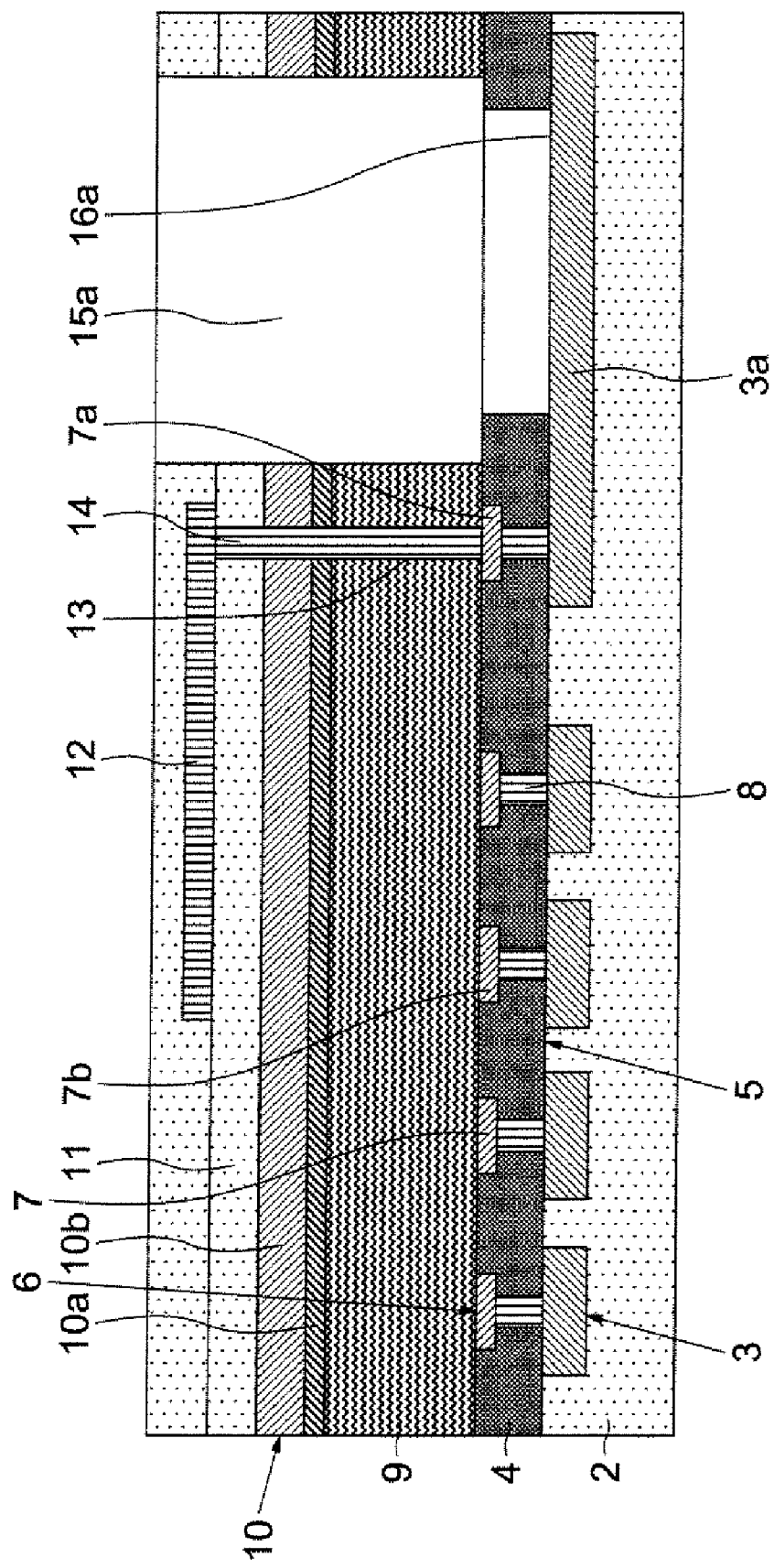
FIG. 8 shows a sectional view of an alternative embodiment of the device of FIG. 1.

Referring to FIG. 8, it may be seen that, according to an alternative embodiment, it would optionally be possible to deposit an additional transparent outer protective layer 11a on the front of the outer layer 10 and of the local layer 12.

Figure 9:
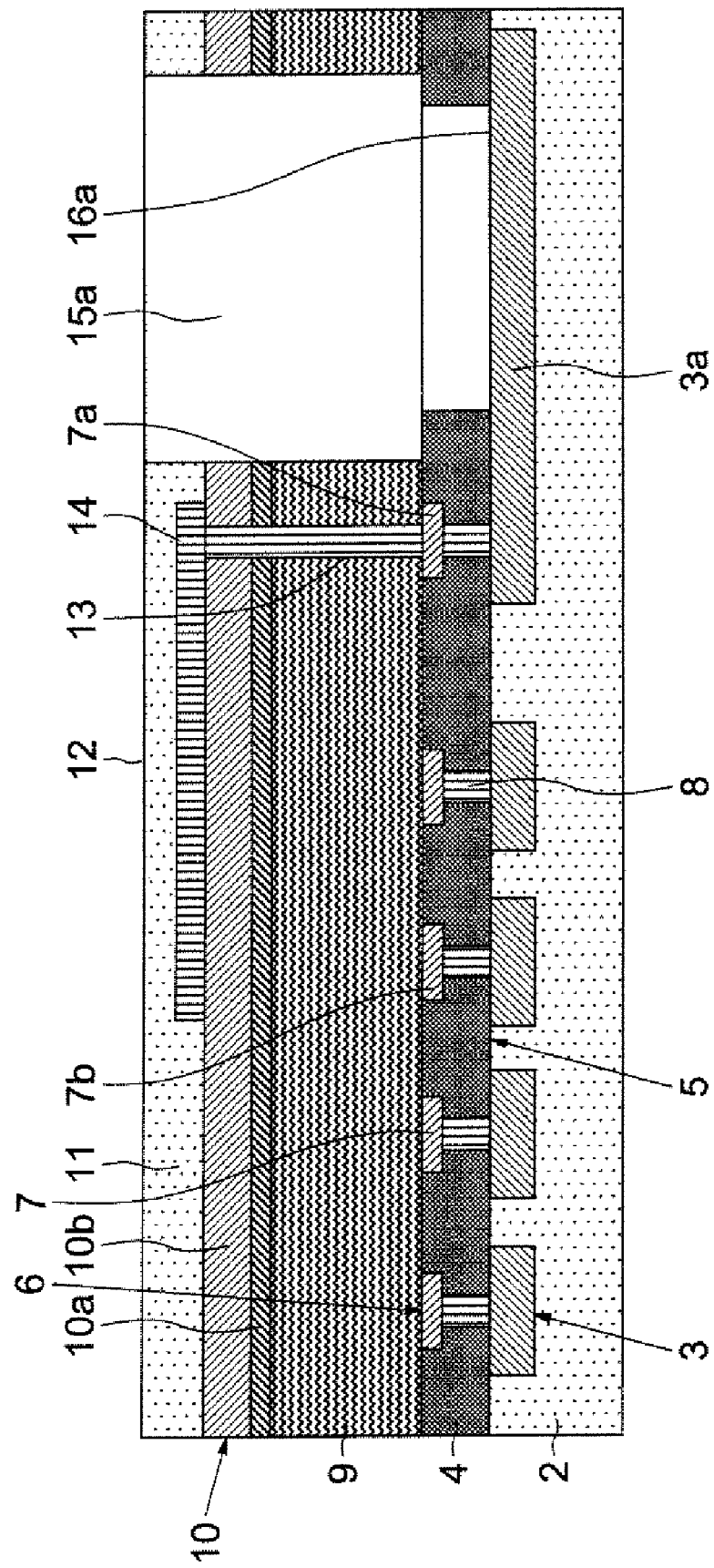
FIG. 9 shows a sectional view of another alternative embodiment of the device of FIG. 1.

Referring to FIG. 9, this shows that, according to another alternative embodiment, it would be possible to form the vias 14 through the layers 9 and 10, to form the local layer 12 on the upper layer 10 and then optionally to form the outer protective layer 11 on the front of this upper layer 10 and of this local layer 12.

The present invention is not limited to the examples described above.

In particular, the local layer 12 does not go right around the matrix 6 but, for example, it could be limited to one side of this matrix. The number of vias 14 could be reduced, and these vias could be provided only around part of the periphery of the matrix 6. Many other alternative embodiments are possible without departing from the framework defined by the appended claims.

While there has been illustrated and described what is presently considered to be embodiments of the present invention, it will be understood by those of ordinary skill in the art that various other modifications may be made, and equivalents may be substituted, without departing from the true scope of the present invention.

Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A semiconductor device comprising:
in a zone, a structure of photosensitive diodes comprising:
a matrix of lower electrodes;
an intermediate layer made of a photosensitive material formed on the matrix of lower electrodes; and
at least one upper electrode formed on the intermediate layer, and wherein the semiconductor device comprises, beneath the intermediate layer, electrical connection means that includes at least one electrical contact pad and at least one electrical connection pad, in that the semiconductor device includes at least one electrical connection via passing through at least the intermediate layer and connecting the at least one upper electrode to the at least one electrical contact pad, and in that the semiconductor device has at least one well formed outside the zone and passing through at least the intermediate layer, this well exposing the electrical connection pad.

2. The device according to claim 1, including an upper layer comprising a first layer constituting upper second electrode and a second layer made of an electrically conductive material, the at least one via and the at least one well passing through this upper layer.

3. The device according to claim 1, including a non-transparent local layer that partly covers the structure of photosensitive diodes.

4. The device according to claim 3, wherein the local layer is made of an electrically conductive material, the at least one via being connected to this local layer.

5. The device according to claim 1, including at least one transparent outer protective layer.

6. The device according to claim 1, further comprising:
a lower dielectric layer in which the matrix of lower electrodes and the at least one electrical contact pad are formed and, beneath this lower layer, a base layer in which the at least one electrical connection pad is formed, the at least one well passing through this lower layer in order to expose this electrical connection pad.

7. The device according to claim 6, including an upper layer comprising a first layer constituting upper second electrode and a second layer made of an electrically conductive material, the at least one via and the at least one well passing through this upper layer.

8. The device according to claim 6, including a non-transparent local layer that partly covers the structure of photosensitive diodes.

9. The device according to claim 8, wherein the local layer is made of an electrically conductive material, the at least one via being connected to this local layer.

10. The device according to claim 8, wherein the local layer and the at least one via are in the same material.

11. The device according to claim 6, including at least one transparent outer protective layer.

12. The semiconductor device of claim 1, wherein the electrical connection means extends under the zone and outside the zone.

13. A process for fabricating a semiconductor device comprising a multiplicity of photosensitive diodes comprising lower electrodes and at least one upper electrode that are separated by an intermediate layer made of a photosensitive material, the process consisting of:
producing a base layer that includes electrical connection means;
forming a dielectric lower layer above the base layer;
producing, in the lower layer, a matrix of lower electrodes that are selectively connected to the electrical connection means;
producing an intermediate layer made of a photosensitive material on the lower layer;
forming an upper layer made of an electrically conductive transparent material;
producing at least one via made of an electrically conductive material through the intermediate and upper layers so as to electrically connect the upper layer and at least one of the lower electrodes; and
producing at least one well through the lower, intermediate and upper layers so as to expose at least one electrical connection pad of the electrical connection means, the at least one electrical connection pad being connected to the at least one via.

14. The process according to claim 13, wherein the at least one via is produced above the corresponding lower electrode.

15. The process according to claim 13, further consisting of: forming an upper layer comprising a first layer made of a first electrically conductive material and a second layer made of a second electrically conductive material.

16. The process according to claim 13, further consisting of: forming a local layer made of a non-transparent material above the upper layer and extending partly above the multiplicity of photosensitive diodes and extending over the at least one via.

17. The process according to claim 13, wherein the local layer and the at least one via are in the same material.

18. The process according to claim 13, further consisting of: forming an outer protective layer made of a transparent material.

* * * * *